United States Patent
Sui et al.

(10) Patent No.: US 11,678,510 B2
(45) Date of Patent: Jun. 13, 2023

(54) DISPLAY PANEL, MANUFACTURING METHOD THEREOF, AND DISPLAY APPARATUS

(71) Applicant: BOE TECHNOLOGY GROUP CO., LTD., Beijing (CN)

(72) Inventors: Kai Sui, Beijing (CN); Zhongyuan Sun, Beijing (CN); Weijie Wang, Beijing (CN); Jinxiang Xue, Beijing (CN); Xiang Zhou, Beijing (CN); Wenqi Liu, Beijing (CN); Jingkai Ni, Beijing (CN); Chao Dong, Beijing (CN); Xiaofen Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 352 days.

(21) Appl. No.: 16/494,417

(22) PCT Filed: Nov. 1, 2018

(86) PCT No.: PCT/CN2018/113452
§ 371 (c)(1),
(2) Date: Sep. 16, 2019

(87) PCT Pub. No.: WO2020/087449
PCT Pub. Date: May 7, 2020

(65) Prior Publication Data
US 2021/0359267 A1 Nov. 18, 2021

(51) Int. Cl.
*H01L 51/52* (2006.01)
*H01L 51/56* (2006.01)
(Continued)

(52) U.S. Cl.
CPC .......... *H01L 51/5256* (2013.01); *H01L 51/56* (2013.01)

(58) Field of Classification Search
None
See application file for complete search history.

(56) References Cited

U.S. PATENT DOCUMENTS 8,624,487 B2 *  1/2014  Han .................... H01L 51/5256
                                                            313/506
8,937,394 B2 *  1/2015  Chen ...................... H01L 21/56
                                                            257/40
(Continued)

FOREIGN PATENT DOCUMENTS

CN       102148336 A       8/2011
CN       102179971 A       9/2011
(Continued)

OTHER PUBLICATIONS

Office Action dated Jun. 14, 2022, issued in counterpart EP Application No. 18932323.1.
(Continued)

*Primary Examiner* — Nishath Yasmeen
(74) *Attorney, Agent, or Firm* — WHDA, LLP

(57) ABSTRACT

The present disclosure is related to a display panel. The display panel may include a display substrate, a plurality of light emitting units on the display substrate, and a first organic layer covering the plurality of light emitting units. A surface of the first organic layer opposite from the light emitting units may include a plurality of raised portions and a plurality of recessed portions. The first organic layer may be directly in contact with the plurality of light emitting units.

18 Claims, 8 Drawing Sheets

(51) Int. Cl.
*H10K 50/844* (2023.01)
*H10K 71/00* (2023.01)

(56) References Cited

U.S. PATENT DOCUMENTS

| | | | |
|---|---|---|---|
| 10,109,809 B2* | 10/2018 | Zhu | B32B 3/10 |
| 11,114,641 B2* | 9/2021 | Xu | H01L 51/0097 |
| 2007/0196682 A1* | 8/2007 | Visser | H01L 23/562 |
| | | | 257/E23.194 |
| 2008/0164810 A1* | 7/2008 | Oda | H01L 27/3258 |
| | | | 445/24 |
| 2011/0156578 A1 | 6/2011 | Jeon et al. | |
| 2011/0212304 A1* | 9/2011 | Han | H01L 27/3244 |
| | | | 427/532 |
| 2012/0243092 A1* | 9/2012 | Muller | H01L 51/448 |
| | | | 359/507 |
| 2012/0256202 A1 | 10/2012 | Lee et al. | |
| 2013/0334959 A1 | 12/2013 | Wang et al. | |
| 2014/0183462 A1 | 7/2014 | Lee et al. | |
| 2015/0236300 A1 | 8/2015 | Naraoka | |
| 2015/0319813 A1 | 11/2015 | Khachatryan et al. | |
| 2016/0024322 A1* | 1/2016 | Jain | H01L 51/5253 |
| | | | 438/46 |
| 2016/0204373 A1* | 7/2016 | Park | H01L 27/3246 |
| | | | 257/40 |
| 2016/0285038 A1* | 9/2016 | Kim | H01L 51/5237 |
| 2017/0018737 A1 | 1/2017 | Kim et al. | |
| 2017/0117504 A1* | 4/2017 | Kim | H01L 51/5256 |
| 2017/0250365 A1 | 8/2017 | Jin et al. | |
| 2018/0046221 A1 | 2/2018 | Choi et al. | |
| 2020/0343485 A1* | 10/2020 | Kim | H01L 51/0096 |

FOREIGN PATENT DOCUMENTS

| | | |
|---|---|---|
| CN | 105552246 A | 5/2016 |
| CN | 106450036 A | 2/2017 |
| CN | 107104127 A | 8/2017 |
| CN | 108400138 A | 8/2018 |
| CN | 108666439 A | 10/2018 |
| JP | 2011-136560 A | 7/2011 |
| KR | 10-2015-0125817 A | 11/2015 |
| WO | 2016140130 A1 | 9/2016 |

OTHER PUBLICATIONS

Office Action dated Jul. 11, 2022, issued in counterpart JP Application No. 2019-558539, with English Translation. (14 pages).
Office Action dated Apr. 9, 2021, issued in counterpart CN Application No. 201880001897.6, with English Translation. (20 pages).
Office Action dated Aug. 3, 2020, issued in counterpart CN Application No. 201880001897.6, with English translatior (21 pages).
International Search Report dated Jul. 25, 2019, issued in counterpart application No. PCT/CN2018/113452. (10 pages).
Office Action dated Mar. 11, 2021, issued in counterpart IN Application No. 201927045174, with English Translation. (6 pages).

* cited by examiner

DISPLAY PANEL, MANUFACTURING METHOD THEREOF, AND DISPLAY APPARATUS

TECHNICAL FIELD

This disclosure relates to display technology, in particular, to a display panel, a manufacturing method thereof, and a display apparatus.

BACKGROUND

A trend of flexible display and stretchable display such as OLED (Organic Light Emitting Diodes) display or quantum dot light emitting display is to minimize bezel for full screen actualization. Flexible display is being considered as the most optimal display for full screen actualization. As such, many display panel manufacturers invest heavily on mass production line of flexible display, rather than rigid display.

BRIEF SUMMARY

Accordingly, one example of the present disclosure is a display panel. The display panel may include a display substrate, a plurality of light emitting units on the display substrate, and a first organic layer covering the plurality of light emitting units. A surface of the first organic layer opposite from the light emitting units may include a plurality of raised portions and a plurality of recessed portions. The first organic layer may be directly in contact with the plurality of light emitting units.

Another example of the present disclosure is a display apparatus. The display apparatus may include the display panel according to one embodiment of the present disclosure.

Another example of the present disclosure is a method of manufacturing a display panel. The method may include providing a display substrate with a plurality of light emitting units on the display substrate and forming a first organic layer covering the plurality of light emitting units. A surface of the first organic layer opposite from the light emitting units may include a plurality of raised portions and a plurality of recessed portions. The first organic layer may be directly in contact with the plurality of light emitting units.

BRIEF DESCRIPTION OF THE DRAWINGS

The subject matter which is regarded as the invention is particularly pointed out and distinctly chimed in the claims at the conclusion of the specification. The foregoing and other objects, features, and advantages of the invention are apparent from the following detailed description taken in conjunction with the accompanying drawings in which:

DETAILED DESCRIPTION

Figure 1:
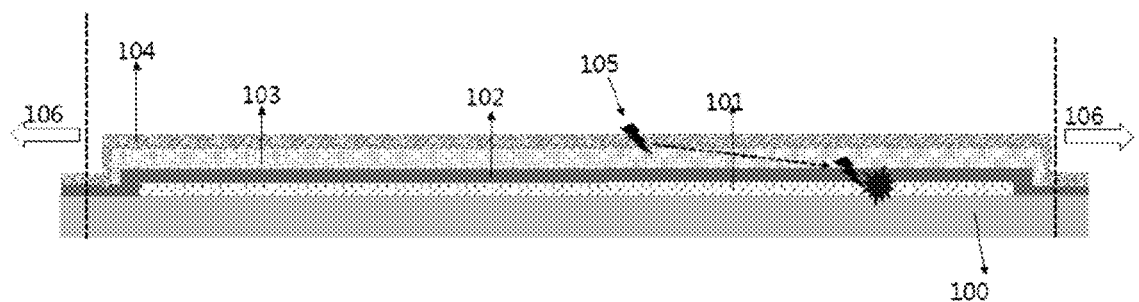
FIG. 1 is a schematic structural diagram of a display panel in the related art.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-5*g*. When referring to the figures, like structures and elements shown throughout are indicated with like reference numerals.

In this specification, the terms "first," "second," etc. may be added as prefixes. These prefixes, however, are only added in order to distinguish the terms and do not have specific meaning such as order and relative merits. In the description of the present disclosure, the meaning of "plural" is two or more unless otherwise specifically defined.

In the description of the specification, references made to the term "some embodiments," "one embodiment," "exemplary embodiments," "example," "specific example," "some examples" and the like are intended to refer that specific features, structures, materials or characteristics described in connection with the embodiment or example are included in at least some embodiments or examples of the present disclosure. The schematic expression of the terms does not necessarily refer to the same embodiment or example. Moreover, the specific features, structures, materials or characteristics described may be included in any suitable manner in any one or more embodiments or examples. A number modified by "about" herein means that the number can vary by 10% thereof.

In the description of the specification, the term "light emitting unit" may be referred to organic light emitting unit, inorganic light emitting unit, or quantum dot light emitting unit.

In the description of the specification, the term "distance" may be referred to the shortest distance between two objects such as two surfaces or one point to one surface.

FIG. 1 is a schematic structural diagram of a display panel in the related at. As shown in FIG. 1, the display panel includes a display substrate 100, a plurality of display units 101 arranged on the display substrate 100, a first inorganic layer 102 covering the display units 101, an organic layer 103 covering the first inorganic layer 102, and a second inorganic layer 104 covering the organic layer 103. These inorganic and organic layers are used to protect the display substrate 100 from penetration of water and oxygen. However, since the inorganic layers 102 and 104 are very thin and frequently subjected to large stresses, these inorganic layers tend to be broken under lateral stresses stretching the display panel in the direction of 106. As a result, the oxygen and water outside the display panel can penetrate some of the plurality of display units 101 along the breaking line, thereby significantly shortening the lifespan of the display panel.

Figure 2:
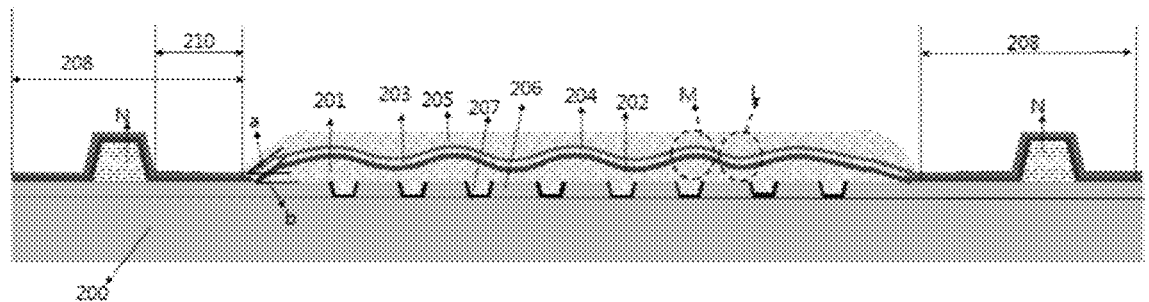
FIG. 2 is a schematic structural diagram of a display panel according to some embodiments of the present disclosure.

Accordingly, FIG. 2 is a schematic structural diagram of a display panel according to some embodiments of the present disclosure. As shown in FIG. 2, the display panel includes a display substrate 200, a pixel define layer 206 which defines a plurality of light emitting units 207, and a first organic layer 201 covering the plurality of light emitting units 207. The display substrate 200 comprises driving circuit, signal lines and electrical elements etc. A surface of the first organic layer 201 opposite from the light emitting units 207 includes a plurality of raised portions M and a plurality of recessed portions L. The first organic layer 201 is directly in contact with the plurality of light emitting units 207 and the pixel defining layer 206.

According to the embodiments of the present disclosure, when the display panel is laterally stretched, the first organic layer can effectively relieve some of the lateral stress because of the plurality of raised portions and the plurality of recessed portions on the surface of the first organic layer.

In some embodiments, the first organic layer 201 includes at least a material selected from the group consisting of polydimethylsiloxane, polyimides, silicone resins, polyurethane, acrylic resins, rubbers and their derivatives, and mixtures thereof.

Figure 3A:
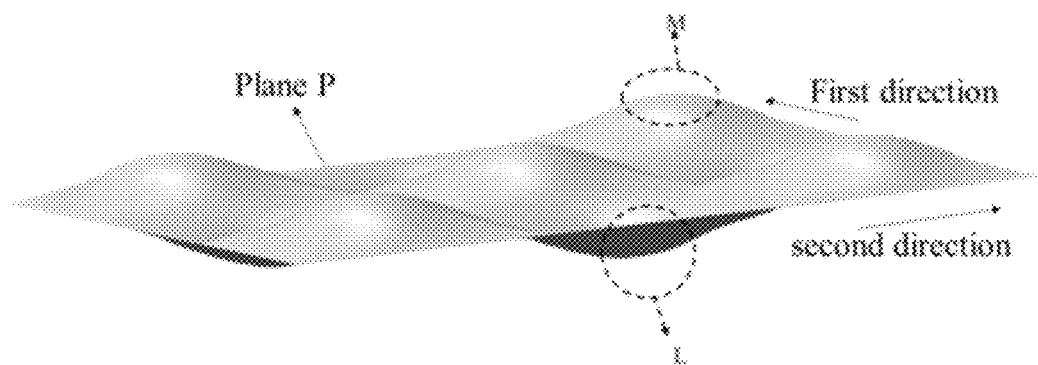
FIG. 3*a* is a three-dimensional structural diagram of the first organic layer according to some embodiments of the present disclosure.

FIG. 3a is a three-dimensional structural diagram of the first organic layer 201 according to some embodiments of the present disclosure. As shown in FIG. 3a, the plurality of raised portions M and the plurality of recessed portions L are alternatively arranged in both a first direction and a second direction, and the first direction is substantially perpendicular to the second direction. In some embodiments, as shown in FIG. 3a, the plurality of the raised portions M is transitioned continuously to the plurality of the recessed portions L respectively. That is, the surface of the first organic layer has a substantially continuous, smooth transition from the curvature of the raised portion to that of the recessed portion and there is not a flat surface between the raised portion and the recessed portion.

In some embodiments, as shown in FIG. 3a, the plurality of raised portions M and the plurality of recessed portions L have a substantially same amplitude relative to the plane P in a range from about 1 um to about 5 um. Plane P is a flat surface of the first organic layer. An amplitude of a raised portion is defined as a vertical distance from a crest of the raised portion to the plane P. An amplitude of a recessed portion is defined as a vertical distance from the trough of the recessed portion to the plane P.

Figure 3B:
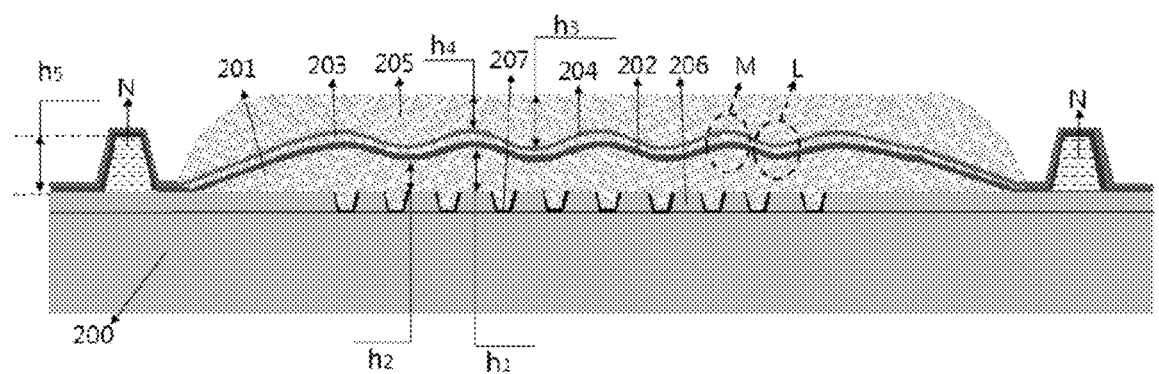
FIG. 3*b* is a schematic structural diagram of a display panel according to some embodiments of the present disclosure.

FIG. 3b is a schematic structural diagram of a display panel according to some embodiments of the present disclosure. A first distance h1 from a crest of one of the plurality of the raised portions to a top surface of the pixel define layer 206 is in a range from about 3 μm to about 11 um, preferably from about 5 μm to about 9 μm, and more preferably from about 6 μm to about 8 μm. A second distance h2 from a trough of one of the plurality of recessed portions to the top surface of the pixel define layer 206 is in a range from about 1 μm to about 8 um, preferably from about 2 μm to about 6 μm. Furthermore, the first distance h1 is larger than the second distance h2. In some embodiments, a distance between crests of two adjacent raised portions M is substantially the same with a distance between troughs of two adjacent recessed portions L, which is in a range from a length of three adjacent light emitting units to a length of eighty adjacent light emitting units. For example, the range is from about 2 um to about 1000 um, preferably from about 80 μm to about 120 μm.

In some embodiments, the first distance h1 is about 6 um.

In some embodiments, the second distance h2 is about 2 um.

In some embodiments, a distance h5 from a top surface of the dam structure N to a top surface of the pixel define layer 206 is in a range from about 1.2 um to about 2.8 um, for example, about 2.0 um.

In some embodiments, as shown in FIG. 2, the display panel further includes a first inorganic layer 202, a second organic layer 203, a second inorganic layer 204, and a third organic layer 205. The first organic layer 201, the first inorganic layer 202, the second organic layer 203, the second inorganic layer 204 and the third organic layer 205 are sequentially arranged in a direction away from the display substrate 200. An orthographic projection of the first organic layer 201 on the display substrate 200 covers an orthographic projection of the plurality of light emitting units 207 on the display substrate 200. An orthographic projection of the first inorganic layer 202 on the display substrate 200 covers the orthographic projection of the first organic layer 201 on the display substrate 200.

In some embodiments, the first inorganic layer 202 and the second inorganic layer 204 each include at least a material selected from the group consisting of SiNx, $SiO_2$, SiC, $Al_2O_3$, ZnS, ZnO and ZSM zeolites. The ZSM zeolite includes a structure of $ZnO/Al_2O_3/MgO$.

In some embodiments, a Young's modulus of the first organic layer 201 is not larger than a Young's modulus of the second organic layer 203.

In some embodiments, since a surface of the first organic layer opposite from the light emitting units includes a plurality of raised portions and a plurality of recessed portions, the first inorganic layer, the second organic layer, and the second inorganic layer are sequentially arranged on the first organic layer and conform to the surface of the first organic layer opposite from the light emitting units. That is, the first inorganic layer, the second organic layer, and the second inorganic layer conform to the shape of the plurality of raised portions and the plurality of recessed portions on the surface of the first organic layer.

Take the first inorganic layer for example, when the display panel is laterally stretched, the first organic layer can effectively relieve some of the stress of the first inorganic layer, thereby maintaining the water/oxygen blocking capacity of the first inorganic layer. As a result, the lifespan of the display substrate is extended.

In some embodiments, the material of the first inorganic layer includes SiNx or SiON, and the thickness of the first inorganic layer is in a range from about 700 nm to about 1400 nm, for example, about 800 nm.

In some embodiments, the material of the first inorganic layer includes $SiO_2$, and the thickness of the first inorganic layer is in a range from about 50 nm to about 400 nm, for example, about 200 nm.

In some embodiments, the material of the first inorganic layer includes $Al_2O_3$, and the thickness of the first inorganic layer is in a range from about 50 nm to about 300 nm, for example, about 120 nm.

In some embodiments, the thickness of the second organic layer is in a range from about 2 um to about 4 um, for example, about 2 um.

In some embodiments, the thickness of the second inorganic layer is in a range from about 0.05 μm to about 3 um In some embodiments, the material of the second inorganic layer includes SiNx or SiON, and the thickness of the second inorganic layer is in a range from about 700 nm to about 1400 nm, for example, about 800 nm.

In some embodiments, the material of the second inorganic layer includes $SiO_2$, and the thickness of the second inorganic layer is in a range from about 50 nm to about 400 nm, for example, about 200 nm.

In some embodiments, the material of the second inorganic layer includes $Al_2O_3$, and the thickness of the second inorganic layer is in a range from about 50 nm to about 300 nm, for example, about 120 nm.

In some embodiments, as shown in the FIG. 3b, the third organic layer has a substantially flat top surface opposite from the display substrate. The second inorganic layer also has a plurality of raised portions and a plurality of recessed portions. A distance h3 from the top surface of the third organic layer opposite from the display substrate to a trough of one of the plurality of recessed portions of the second inorganic layer is in a range from about 3 um to about 11 um, preferably from about 4 μm to 9 μm, for example, about 6 um. A distance h4 from the top surface of the third organic layer opposite from the display substrate to a crest of one of the plurality of raised portions of the second inorganic layer is in a range from about 1 um to about 8 um, preferably from about 2 μm to about 6 μm, for example, about 2 μm.

Figure 4A:
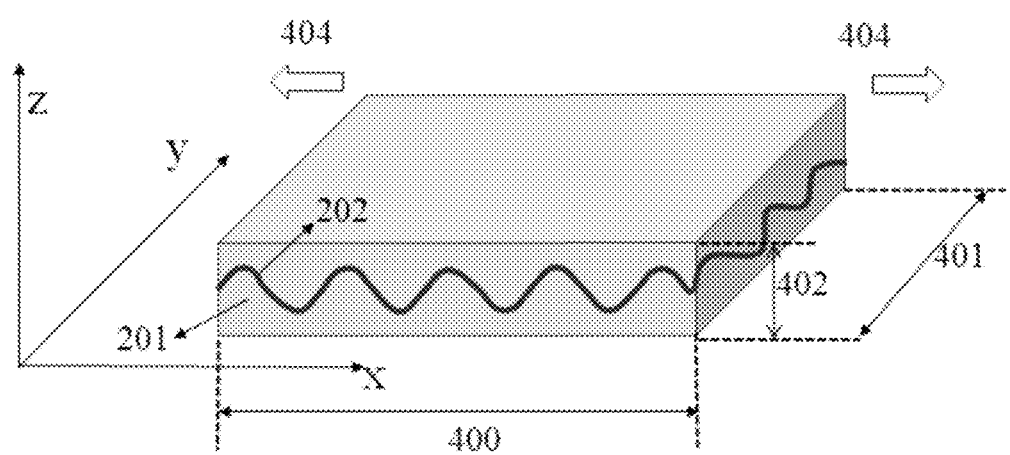
FIG. 4*a* is a schematic cross-sectional diagram of the display panel according to some embodiments of the present disclosure.

FIG. 4a is a schematic cross-section of the display panel in planes perpendicular to the display substrate according to some embodiments of the present disclosure 404 is the direction of lateral stresses which stretches the display panel, and 400 is the length of the display panel, 401 is the width of the display panel and 402 is the thickness of the display panel. A side of the cross-section of the first organic layer 201 in a plane perpendicular to the display substrate 200 opposite from the display substrate has a shape of a sine wave, which means the first inorganic layer 202 arranged on the first organic layer 201 has a shape of a sine wave both along the direction of the length 400 of the display panel and the direction of the width 401 of the display panel, as shown in FIG. 4a-4c.

As shown in FIG. 4a, when the display panel is laterally stretched in the direction of 404, which parallel to the axis x, the display panel will be stretched longer in the direction of axis x, and contract in length in the directions of both axis y and axis z.

Figure 4B:
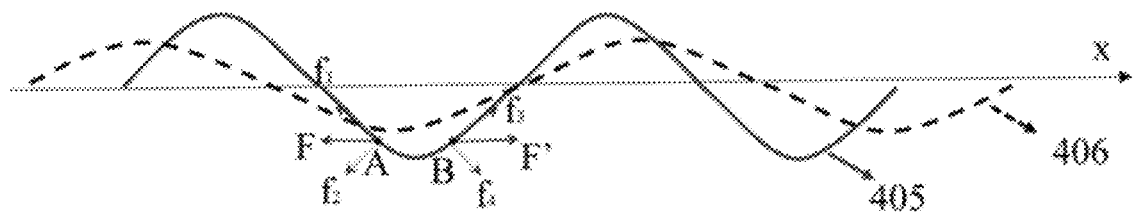
FIG. 4*b* is a force analysis diagram of the first inorganic layer according to some embodiments of the present disclosure.
Figure 4C:
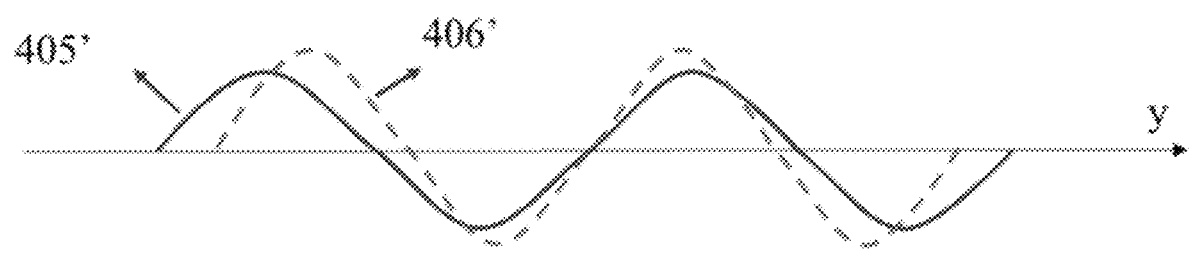
FIG. 4*c* is a schematic diagram of the first inorganic layer before and after stretching in a direction of y axis according to some embodiments of the present disclosure.

Without being held to a particular theory, FIG. 4b is a force analysis diagram of the first inorganic layer according to some embodiments of the present disclosure. As shown in FIG. 4b, when the display panel is laterally stretched in the direction of 404, the first inorganic layer 202 is transformed from waveform 405 to waveform 406 in the direction of axis x. As shown in FIGS. 4a and 4b, the display panel is laterally stretched in the direction of 404 at both ends thereof with force F and F'. Two points A and B on the waveform 405 are taken for illustration purpose. The point A and point B are symmetrical with respect to a trough of a recessed portion.

The force F at the point A can be decomposed into force f1 and force f2 in the tangent direction and the normal direction to the waveform 405 respectively. The force F' at the point B can be decomposed into force f3 and force f4 in the tangent direction and the normal direction to the waveform 405 respectively. As shown in FIG. 4b, a magnitude of force F is substantially equal to that of force F'. A magnitude of force $f_1$ is substantially equal to that of force $f_3$. A magnitude of force $f_2$ is substantially equal to that of force $f_4$. Force $f_1$ is a force that flattens the first inorganic layer, force $f_2$ is a force that keeps the arc from shifting upward. During stretching, the angle between the force F and force $f_1$ becomes smaller, but the angle between the force F and force $f_2$ becomes larger. The larger the curvature is, the stronger stretchable ability the first inorganic layer has, by choosing an appropriate curvature of the waveform, the first inorganic layer would have appropriate stretchable ability.

While in the direction of axis y, the waveform of the first inorganic layer 202 is transformed from waveform 405' to waveform 406' when the display panel is laterally stretched in the direction of 404, as shown in FIG. 4c. As shown in FIG. 4c, the distance between two adjacent crests or troughs of the waveform 406' is smaller than the distance between two adjacent crests or troughs of the waveform 405' respectively. That is, the first inorganic layer contracts in the direction of axis y.

In some embodiments, as shown in FIG. 2, the display panel further includes a dam structure N. The dam structure N may be a circular structure surrounding the plurality of light emitting units 207. The dam structure may be configured to prevent spilling of the first organic layer, the second organic layer and third organic layer.

In some embodiments, as shown in FIG. 2, the first inorganic layer 202 and/or the second inorganic layer 204 extend to the dam structure N and directly cover a top surface of the dam structure N.

As shown in FIG. 2, the shortest distance 208 between an edge of the first organic layer to an edge of the display substrate is in a range from about 500 um to about 2000 um. The shortest distance 210 between an edge of the first organic layer to a front edge of the dam structure facing the first organic layer is not larger than about 500 um. The bank angle b of the first inorganic layer 202 outside the display area, relative to the top surface of the pixel define layer 206 is in a range from 0 to 90 degree. The bank angle a of the second inorganic layer 204 outside the display area, relative to a plane parallel to the top surface of the pixel define layer 206 is in a range from 0 to 90 degree.

In some embodiments, the display substrate 200 includes a material selected from the group consisting of polyimides and derivatives thereof, rubbers, silicones, polyurethanes, and acrylic resins.

In some embodiments, the maximum lateral stretching rate of the display panel is in a range from about 4% to about 8%, preferably from about 5% to about 7%, for example, about 5%.

Another example of the present disclosure is a display apparatus. The display apparatus includes the display panel according to any one of the embodiments of the present disclosure.

In some embodiments, the display apparatus further includes a circular polarizer. The circular polarizer may be configured to improve at least the outdoor display quality of the display panel.

Another example of the present disclosure is a method of manufacturing a display panel. The method may include steps of providing a display substrate with a plurality of light emitting units arranged on the display substrate and forming a first organic layer covering the plurality of light emitting units. A surface of the first organic layer opposite from the light emitting units includes a plurality of raised portions and a plurality of recessed portions, and the first organic layer is directly in contact with the plurality of light emitting units.

In some embodiments, forming the first organic layer covering the plurality of light emitting units includes steps of forming a film of an first organic material, forming a plurality of recessed portions on the film of the first organic material, and forming a plurality of raised portions among the plurality of recessed portions on the film of the first organic material.

In some embodiments, prior to the step of forming the plurality of light emitting units, the method further includes a step of forming a pixel define layer. The pixel defining layer defines the plurality of light emitting units.

In some embodiments, the method of manufacturing a display panel further includes a step of forming a dam structure. The dam structure surrounds the plurality of the light emitting units. The step of forming a dam structure may be prior to forming the first organic layer.

The method of manufacturing a display panel according to some embodiments of the present disclosure is described in detail below with reference to FIGS. 5a to 5g.

Figure 5A:
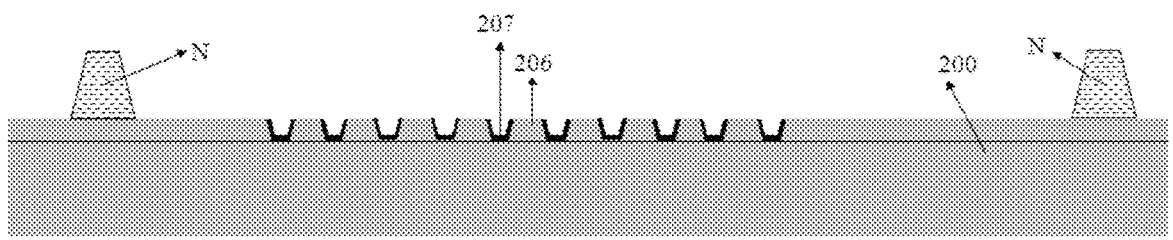
FIGS. 5*a*-5*g* are illustration of fabrication steps for manufacturing a display panel according to some embodiments contemplated by the present disclosure.

In some embodiments, as shown in FIG. 5a, a display substrate 200 with a plurality of light emitting units 207 arranged on the display substrate 200 is provided. The plurality of light emitting units 207 is defined by the pixel defining layer 206. A dam structure N is formed by a patterning process on the display substrate 200. The dam structure N surrounds the plurality of the light emitting units 207.

Figure 5B:
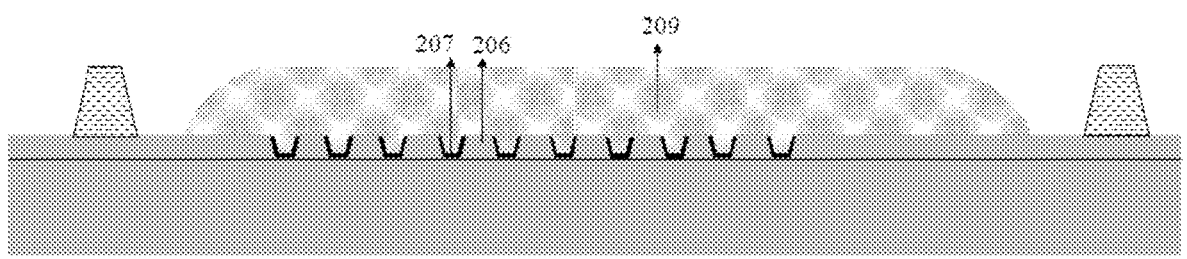

In some embodiments, as shown in FIG. 5b, a film of the first organic material 209 is formed covering the plurality of the light emitting units 207.

In some embodiments, forming the film of the first organic material includes forming a film of oligomers by an ink-jet printing technique, followed by curing the film of the oligomers by ultra violet light.

In some embodiments, forming the film of the first organic material includes forming a film of a polymer solution by an ink-jet printing technique, followed by solidifying the film of the polymer solution through evaporation of the solvent.

In some embodiments, the thickness of the film of the first organic material is in a range from about 4 um to about 12 um, for example, about 7 um.

Figure 5C:
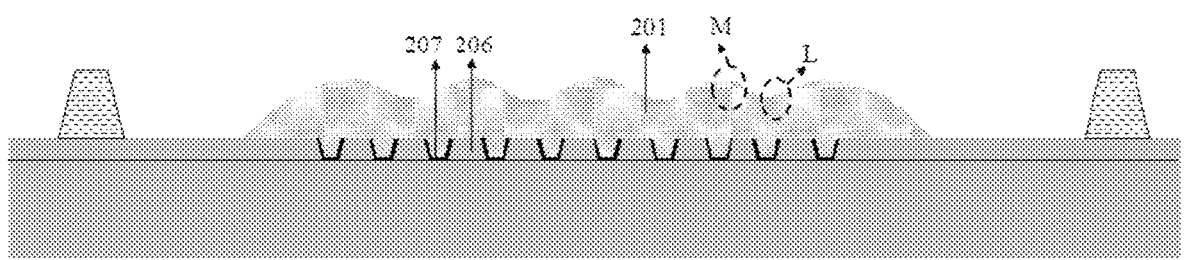

In some embodiments, as shown in FIG. 5c, a plurality of the recessed portions is formed on the film of the first organic material 209 by a nano-imprinting technique, a reactive ion etching technique, an inductively coupled plasma technique, a stencil printing technique, a gravure technique, or a flexographic printing technique. The second distance from a trough of one of the plurality of the recessed portions to the top surface of the pixel define layer is in a range from about 1 μm to about 8 um, for example, about 2 um.

In some embodiments, as shown in FIG. 5c, a plurality of raised portions is formed on the film of the first organic material at spaces among the plurality of recessed portions by an ink-jet printing technique. The first distance from a crest of one of the plurality of raised portions to a top surface of the pixel define layer is in a range from about 3 μm to about 11 um, for example, about 6 um.

In some embodiments, the plurality of raised portions and the plurality of the recessed portions are formed on the film of the first organic material by a laser direct-writing technique. The energy of the laser can be controlled by applying a certain pulse so as to form a three-dimensional shape of the plurality of raised portions and the plurality of the recessed portions.

In some embodiments, as shown in FIG. 5c, a first organic layer 201 is formed, and a surface of the first organic layer 201 opposite from the light emitting units 207 includes a plurality of raised portions M and a plurality of recessed portions L.

In some embodiments, the method of manufacturing a display panel further includes a step of forming a first inorganic layer by a chemical vapor deposition technique, a magnetron sputtering technique, or an atomic layer deposition technique.

Figure 5D:
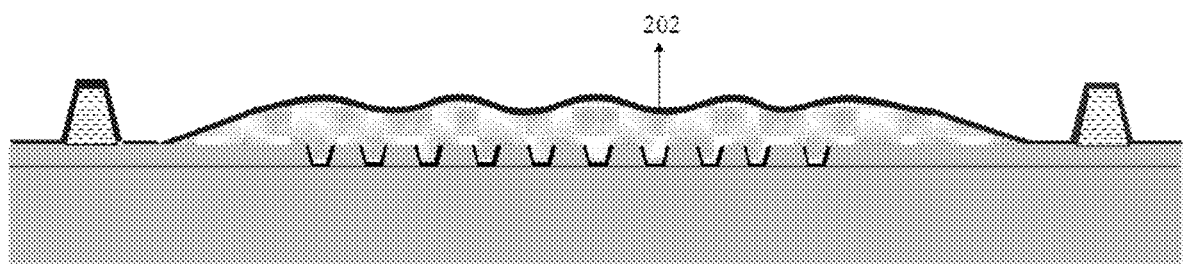

In one embodiment, as shown in FIG. 5d, a first inorganic layer 202 is formed. The first inorganic layer 202 conforms to the shape of the surface of the first organic layer underneath. As a result, the first inorganic layer 202 also includes s a plurality of raised portions and a plurality of recessed portions. Furthermore, the first inorganic layer 202 extends to the dam structure N and directly covers a top surface of the dam structure N. In one embodiment, he first inorganic layer 202 has a substantially uniform thickness.

In some embodiments, the material of the first inorganic layer includes SiNx or SiON, and the first inorganic layer is formed by a chemical vapor deposition technique. A thickness of the first inorganic layer is in a range from about 700 nm to about 1400 nm, for example, about 800 nm.

In some embodiments, the material of the first inorganic layer includes $SiO_2$, and the first inorganic layer is formed by an atomic layer deposition technique. A thickness of the first inorganic layer is in a range from about 50 nm to about 400 nm, for example, about 200 nm.

In some embodiments, the material of the first inorganic layer includes $Al_2O_3$, and the first inorganic layer is formed by an atomic layer deposition technique. A thickness of the first inorganic layer is in a range from about 50 nm to about 300 nm, for example, about 120 nm.

In some embodiments, the method of manufacturing a display panel further includes a step of forming a second organic layer. The second organic layer may be formed using the same method described in the above embodiments of forming the first organic layer. A thickness of the film of the second organic material is in a range from about 2 um to about 4 um, for example, about 2 um.

Figure 5E:
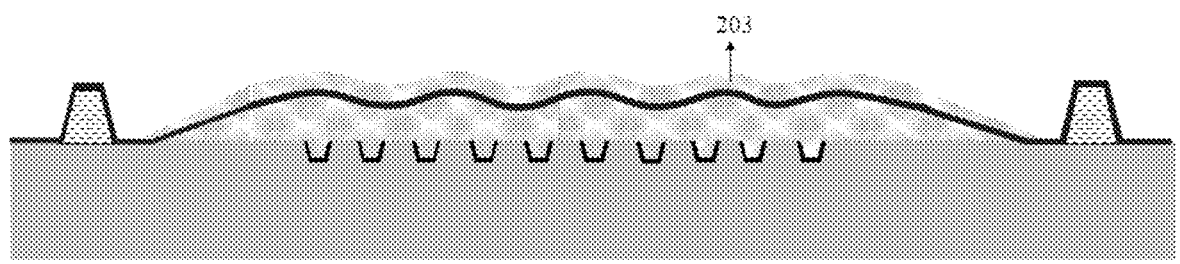

In one embodiment, as shown in FIG. 5e, a second organic layer 203 is formed. The second organic layer 203 conforms to the shape of the first inorganic layer 202 underneath. As a result, the second organic layer also includes a plurality of raised portions and a plurality of recessed portions.

In some embodiments, the method of manufacturing a display panel further includes a step of forming a second inorganic layer by a chemical vapor deposition technique, a magnetron sputtering technique, or an atomic layer deposition technique. A thickness of the second inorganic layer is in a range from about 0.05 μm to about 3 um, preferably from about 0.5 μm to about 2 μm In some embodiments, the material of the second inorganic layer includes SiNx or SiON, and the second inorganic layer is formed by a chemical vapor deposition technique. A thickness of the second inorganic layer is in a range from about 700 nm to about 1400 nm, for example, about 800 m.

In some embodiments, the material of the second inorganic layer includes $SiO_2$, and the second inorganic layer is formed by an atomic layer deposition technique. A thickness of the second inorganic layer is in a range from about 50 nm to about 400 nm, for example, about 200 nm.

In some embodiments, the material of the second inorganic layer includes $Al_2O_3$, and the second inorganic layer is formed by an atomic layer deposition technique. A thickness of the second inorganic layer is in a range from about 50 nm to about 300 nm, for example, about 120 nm.

Figure 5F:
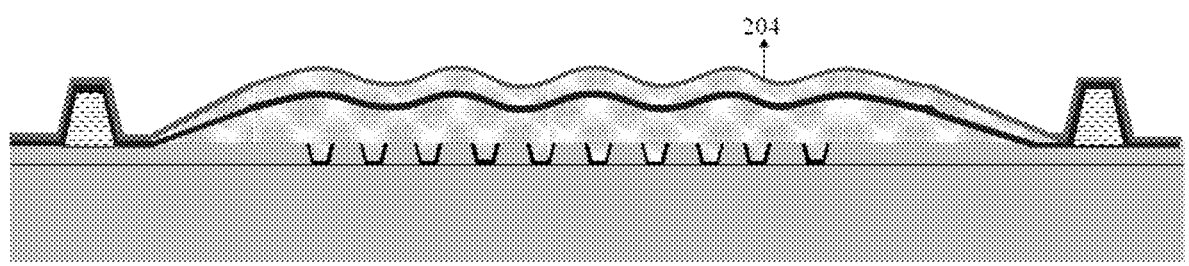

In one embodiment, as shown in FIG. 5f, a second inorganic layer 204 is formed. The second inorganic layer 204 conforms to the shape of the second organic layer 203 underneath. As a result, the second inorganic layer 204 also includes a plurality of raised portions and a plurality of recessed portions. Furthermore, the second inorganic layer 204 extends to the dam structure N and directly covers a top surface of the dam structure N.

Figure 5G:
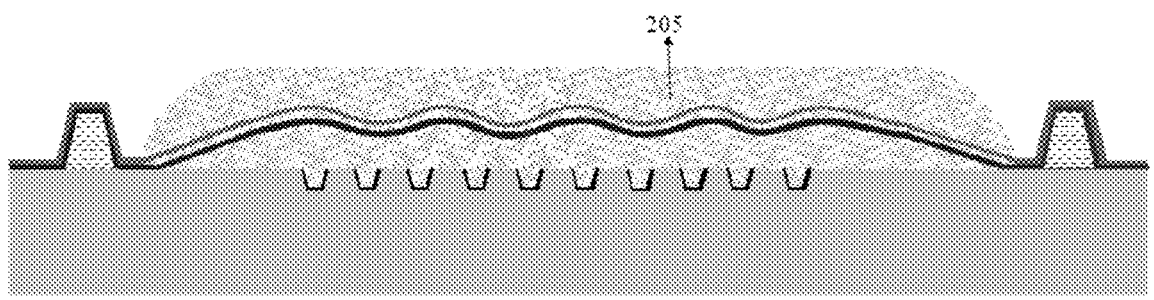

In some embodiments, the method of manufacturing a display panel further include a step of forming a third organic layer by an ink-jet printing technique followed by a solidifying process or a curing process. The third organic layer has a substantially flat top surface opposite from the display substrate, In one embodiment, as shown in FIG. 5g, third organic layer 205 is formed.

The method of manufacturing a display panel according to some embodiments of the present disclosure is compatible to the present manufacturing process. Thus, there's no need to modify the existing manufacturing line, thereby reducing the production cost.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A display panel comprising,
a display substrate;
a plurality of light emitting units on the display substrate; and
a first organic layer covering the plurality of light emitting units;
wherein a surface of the first organic layer opposite from the light emitting units comprises a plurality of raised portions and a plurality of recessed portions, and the first organic layer is directly in contact with the plurality of light emitting units;
the display panel further includes a first inorganic layer, a second organic layer, a second inorganic layer, and a third organic layer;
the first organic layer, the first inorganic layer, the second organic layer, the second inorganic layer, and the third organic layer are sequentially arranged in a direction away from the display substrate;
the first inorganic layer, the second organic layer, and the second inorganic layer conform to a surface profile formed by the plurality of raised portions and the plurality of recessed portions, and the third organic layer has a flat top surface at a side of the third organic layer opposite from the display substrate;
a Young's modulus of the first organic layer is not larger than a Young's modulus of the second organic layer;
the display panel further includes a dam structure, and the plurality of light emitting units is surrounded by the dam structure;
there is an edge area between an edge of the first organic layer and a front edge of the dam structure, and the first inorganic layer and the second inorganic layer are in contact with each other in the edge area; and
the first organic layer and the second organic layer form bank angles less than 90 degree to transit to the edge area.

2. The display panel according to claim 1, wherein the first organic layer comprises at least a material selected from the group consisting of polydimethylsiloxane, polyimides, silicone resins, polyurethane, acrylic resins, rubber and their derivatives, and mixtures thereof.

3. The display panel according to claim 1, wherein the plurality of raised portions and the plurality of recessed portions are alternatively arranged in both a first direction and a second direction, and the first direction is perpendicular to the second direction.

4. The display panel according to claim 1, wherein the plurality of raised portions and the plurality of recessed portions substantially have a same amplitude.

5. The display panel according to claim 1, wherein the plurality of the raised portions is transitioned continuously to the plurality of the recessed portions respectively.

6. The display panel according to claim 1, wherein a side of a cross-section of the first organic layer in a plane perpendicular to the display substrate opposite from the display substrate has a shape of a sine wave.

7. The display panel according to claim 1, further comprising a pixel defining layer, wherein the pixel defining layer defines the plurality of light emitting units, and the first organic layer is directly in contact with the pixel defining layer.

8. The display panel according to claim 7, wherein a first distance from a crest of one of the plurality of raised portions to a top surface of the pixel defining layer is in a range from about 3 μm to about 1 1um; a second distance from a trough of one of the plurality of the recessed portions to the top surface of the pixel defining layer is in a range from about 1 μm to about 8 um; and the first distance is bigger than the second distance.

9. The display panel according to claim 8, wherein a distance between crests of two adjacent raised portions is substantially the same with a distance between troughs of two adjacent recessed portions.

10. The display panel according to claim 7, wherein an orthographic projection of the first organic layer on the display substrate covers an orthographic projection of the plurality of light emitting units on the display substrate, and an orthographic projection of the first inorganic layer on the display substrate covers an orthographic projection of the first organic layer on the display substrate.

11. The display panel according to claim 1, wherein the first inorganic layer and/or the second inorganic layer extend to the dam structure and directly covers a top surface of the dam structure.

12. A display apparatus, comprising the display panel according to claim 1.

13. A method of manufacturing a display panel, comprising:
providing a display substrate with a plurality of light emitting units on the display substrate; and
forming a first organic layer covering the plurality of light emitting units;
forming a first inorganic layer, a second organic layer, a second inorganic layer, and a third organic layer on the first organic layer sequentially;
wherein a surface of the first organic layer opposite from the light emitting units comprises a plurality of raised portions and a plurality of recessed portions, and the first organic layer is directly in contact with the plurality of light emitting units;
the first inorganic layer, the second organic layer, and the second inorganic layer conform to a surface profile formed by the plurality of raised portions and the plurality of recessed portions, and the third organic layer has a flat top surface at a side of the third organic layer opposite from the display substrate;

a Young's modulus of the first organic layer is not larger than a Young's modulus of the second organic layer;

the display panel further includes a dam structure, and the plurality of light emitting units is surrounded by the dam structure;

there is an edge area between an edge of the first organic layer and a front edge of the dam structure, and the first inorganic layer and the second inorganic layer are in contact with each other in the edge area; and the first organic layer and the second organic layer form bank angles less than 90 degree to transit to the edge area.

14. The method according to claim 13, wherein forming the first organic layer covering the plurality of light emitting units comprises:

forming a film of an organic material;

forming the plurality of recessed portions on the film of the organic material; and forming the plurality of raised portions among the plurality of recessed portions.

15. The method according to claim 14, wherein forming the film of the organic material comprises:

forming a film of oligomers by an ink-jet printing technique; and curing the film of the oligomers by ultra violet light to form the film of the organic material.

16. The method according to claim 14, wherein the plurality of raised portions is formed on the film of the organic material among the plurality of recessed portions by an ink-jet printing technique.

17. The display panel according to claim 1, wherein the dam structure surrounds the third organic layer, and the third organic layer is disposed on the second inorganic layer.

18. The method according to claim 14, further comprising:

forming a dam structure surrounding the plurality of light emitting units, wherein the dam structure surrounds the third organic layer, and the third organic layer is disposed on the second inorganic layer.

* * * * *